(12) United States Patent
Feng et al.

(10) Patent No.: US 8,625,221 B2
(45) Date of Patent: Jan. 7, 2014

(54) DETECTOR PRUNING CONTROL SYSTEM

(75) Inventors: Wei Feng, Shanghai (CN); Lei Wang, Shanghai (CN)

(73) Assignee: LSI Corporation, Milpitas, CA (US)

( * ) Notice: Subject to any disclaimer, the term of this patent is extended or adjusted under 35 U.S.C. 154(b) by 194 days.

(21) Appl. No.: 13/327,279

(22) Filed: Dec. 15, 2011

(65) Prior Publication Data

US 2013/0155541 A1   Jun. 20, 2013

(51) Int. Cl.
*G11B 5/09*         (2006.01)
*H04B 1/66*         (2006.01)
*H03M 13/03*        (2006.01)

(52) U.S. Cl.
USPC ............... 360/51; 360/53; 375/341; 714/792

(58) Field of Classification Search
None
See application file for complete search history.

(56) References Cited

U.S. PATENT DOCUMENTS

| | | |
|---|---|---|
| 5,278,703 A | 1/1994 | Rub |
| 5,278,846 A | 1/1994 | Okayama |
| 5,317,472 A | 5/1994 | Schweitzer, III |
| 5,325,402 A | 6/1994 | Ushirokawa |
| 5,392,299 A | 2/1995 | Rhines |
| 5,417,500 A | 5/1995 | Martinie |
| 5,513,192 A | 4/1996 | Janku |
| 5,523,903 A | 6/1996 | Hetzler |
| 5,550,810 A | 8/1996 | Monogioudis et al. |
| 5,550,870 A | 8/1996 | Blaker |
| 5,612,964 A | 3/1997 | Haraszti |
| 5,710,784 A | 1/1998 | Kindred |
| 5,717,706 A | 2/1998 | Ikeda |
| 5,802,118 A | 9/1998 | Bliss |
| 5,844,945 A | 12/1998 | Nam |
| 5,898,710 A | 4/1999 | Amrany |
| 5,923,713 A | 7/1999 | Hatakeyama |
| 5,978,414 A | 11/1999 | Nara |
| 5,983,383 A | 11/1999 | Wolf |
| 6,005,897 A | 12/1999 | Mccallister |
| 6,023,783 A | 2/2000 | Divsalar |
| 6,029,264 A | 2/2000 | Kobayashi |
| 6,065,149 A | 5/2000 | Yamanaka |
| 6,097,764 A | 8/2000 | McCallister |
| 6,145,110 A | 11/2000 | Khayrallah |
| 6,216,249 B1 | 4/2001 | Bliss |
| 6,216,251 B1 | 4/2001 | McGinn |
| 6,266,795 B1 | 7/2001 | Wei |

(Continued)

OTHER PUBLICATIONS

Axvig et al., "Average Min-Sum Decoding of LDPC Codes", 5th International Symposium on Turbo Codes and Related Topics (2008).

(Continued)

*Primary Examiner* — Regina N Holder

(74) *Attorney, Agent, or Firm* — Hamilton DeSanctis & Cha

(57) ABSTRACT

Various embodiments of the present invention provide apparatuses, systems and methods for data detection in a detector with a pruning control system. For example, a data detector is disclosed that includes a first set of counters operable to distinguish prunable data from non-prunable data in the data detector, a second set of counters operable to generate initial values for the first set of counters, and a prune control signal generator operable to generate a prune control signal based on the first set of counters. The second set of counters is operable to generate the initial values at least in part before a syncmark is detected in a data sector. The initial values are used to initialize the first set of counters when the syncmark is detected in the data sector. The prune control signal controls whether the data detector is allowed to prune a trellis.

20 Claims, 5 Drawing Sheets

(56) References Cited

U.S. PATENT DOCUMENTS

| | | |
|---|---|---|
| 6,317,472 B1 | 11/2001 | Choi |
| 6,351,832 B1 | 2/2002 | Wei |
| 6,377,610 B1 | 4/2002 | Hagenauer |
| 6,381,726 B1 | 4/2002 | Weng |
| 6,473,878 B1 | 10/2002 | Wei |
| 6,535,553 B1 | 3/2003 | Limberg et al. |
| 6,625,775 B1 | 9/2003 | Kim |
| 6,748,034 B2 | 6/2004 | Hattori |
| 6,757,862 B1 | 6/2004 | Marianetti, II |
| 6,785,863 B2 | 8/2004 | Blankenship |
| 6,810,502 B2 | 10/2004 | Eidson |
| 6,970,511 B1 | 11/2005 | Barnette |
| 6,986,098 B2 | 1/2006 | Poeppelman |
| 7,047,474 B2 | 5/2006 | Rhee |
| 7,058,873 B2 | 6/2006 | Song |
| 7,073,118 B2 | 7/2006 | Greenberg |
| 7,093,179 B2 | 8/2006 | Shea |
| 7,117,427 B2 | 10/2006 | Ophir |
| 7,133,228 B2 | 11/2006 | Fung |
| 7,184,486 B1 | 2/2007 | Wu |
| 7,191,378 B2 | 3/2007 | Eroz |
| 7,203,887 B2 | 4/2007 | Eroz |
| 7,308,061 B1 | 12/2007 | Huang |
| 7,310,768 B2 | 12/2007 | Eidson |
| 7,313,750 B1 | 12/2007 | Feng |
| 7,370,258 B2 | 5/2008 | Iancu |
| 7,415,651 B2 | 8/2008 | Argon |
| 7,502,189 B2 | 3/2009 | Sawaguchi |
| 7,523,375 B2 | 4/2009 | Spencer |
| 7,587,657 B2 | 9/2009 | Haratsch |
| 7,590,168 B2 | 9/2009 | Raghavan |
| 7,646,829 B2 | 1/2010 | Ashley |
| 7,702,986 B2 | 4/2010 | Bjerke |
| 7,752,523 B1 | 7/2010 | Chaichanavong |
| 7,779,325 B2 | 8/2010 | Song |
| 7,802,172 B2 | 9/2010 | Vila Casado et al. |
| 7,952,824 B2 | 5/2011 | Dziak |
| 7,958,425 B2 | 6/2011 | Chugg |
| 7,996,746 B2 | 8/2011 | Livshitz |
| 8,018,360 B2 | 9/2011 | Nayak |
| 8,201,051 B2 | 6/2012 | Tan |
| 8,237,597 B2 | 8/2012 | Liu |
| 8,261,171 B2 | 9/2012 | Annampedu |
| 8,291,284 B2 | 10/2012 | Savin |
| 8,295,001 B2 | 10/2012 | Liu |
| 2008/0069373 A1 | 3/2008 | Jiang |
| 2008/0304558 A1 | 12/2008 | Zhu et al. |
| 2009/0132893 A1 | 5/2009 | Miyazaki |
| 2009/0185643 A1 | 7/2009 | Fitzpatrick |
| 2011/0167227 A1 | 7/2011 | Yang |
| 2011/0264987 A1 | 10/2011 | Li |
| 2012/0124118 A1 | 5/2012 | Ivkovic |
| 2012/0182643 A1 | 7/2012 | Zhang |
| 2012/0207201 A1 | 8/2012 | Xia |
| 2012/0212849 A1 | 8/2012 | Xu |
| 2012/0262814 A1 | 10/2012 | Li |
| 2012/0265488 A1 | 10/2012 | Sun |

OTHER PUBLICATIONS

Bahl et al., "Optimal decoding of linear codes for minimizing symbol error rate", IEEE Trans. Inform. Theory, vol. 20, pp. 284-287 (Mar. 1974).

Blaum, "High-Rate Modulation Codes for Reverse Concatenation", IEEE Transactions on Magnetics, vol. 43, No. 2 (Feb. 2007).

Casado et al., Multiple-rate low- density parity-check codes with constant blocklength, IEEE Transations on communications, Jan. 2009, vol. 57, pp. 75-83.

Cui et al., "High-Throughput Layered LDPC Decoding Architecture", IEEE Transactions on Very Large Scale Integration (VLSI) Systems, vol. 17, No. 4 (Apr. 2009).

Fan et al., "Constrained coding techniques for soft iterative decoders" Proc. IEEE Global Telecommun. Conf., vol. 1b, pp. 631-637 (1999).

Fossorier, Marc P.C. "Quasi-Cyclic Low-Density Parity-Check Codes From Circulant Permutation Maricies" IEEE Transactions on Information Theory, vol. 50, No. 8 Aug. 8, 2004.

Gross, "Stochastic Decoding of LDPC Codes over GF(q)", HDPCC Workshop, Tel Aviv (Mar. 2, 2010).

Gunnam et al., "VLSI Architectures for Layered Decoding for Irregular LDPC Codes of WiMax", IEEE ICC Proceedings (2007).

Hagenauer, J. et al A Viterbi Algorithm with Soft-Decision Outputs and its Applications in Proc. IEEE Globecom, pp. 47. 11-47 Dallas, TX Nov. 1989.

Han and Ryan, "Pinning Techniques for Low-Floor Detection/Decoding of LDPC-Coded Partial Response Channels", 5th International Symposium on Turbo Codes &Related Topics, 2008.

Kautz, "Fibonacci Codes for Synchronization Control", IEEE Trans. Info. Theory, vol. 11, No. 2, pp. 284-292 (Apr. 1965).

Kschischang et al., "Factor Graphs and the Sum-Product Algorithm", IEEE Transactions on Information Theory, vol. 47, No. 2 (Feb. 2001).

Leduc-Primeau et al., "A Relaxed Half-Stochastic Iterative Decoder for LDPC Codes", IEEE Communications Society, IEEE Globecom proceedings (2009).

Lee et al., "Partial Zero-Forcing Adaptive MMSE Receiver for DS-CDMA Uplink in Multicell Environments" IEEE Transactions on Vehicular Tech. vol. 51, No. 5, Sep. 2002.

Li et al "Efficient Encoding of Quasi-Cyclic Low-Density Parity Check Codes" IEEE Transactions on Communications on 53 (11) 1973-1973, 2005.

Lim et al. "Convergence Analysis of Constrained Joint Adaptation in Recording Channels" IEEE Trans. on Signal Processing vol. 54, No. 1 Jan. 2006.

Lin et al "An efficient VLSI Architecture for non binary LDPC decoders"—IEEE Transaction on Circuits and Systems II vol. 57, Issue 1 (Jan. 2010) pp. 51-55.

Moon et al, "Pattern-dependent noise prediction in signal-dependent Noise," IEEE JSAC, vol. 19, No. 4 pp. 730-743, Apr. 2001.

Moon et al., "Maximum transition run codes for data storage systems", IEEE Trans. Magn., vol. 32, No. 5, pp. 3992-3994 (Sep. 1996).

Shokrollahi "LDPC Codes: An Introduction", Digital Fountain, Inc. (Apr. 2, 2003).

Spagnol et al, "Hardware Implementation of GF($2^m$) LDPC Decoders", IEEE Transactions on Circuits and Systemssi: Regular Papers, Vol. 56, No. 12 (Dec. 2009).

Tehrani et al., "Fully Parallel Stochastic LDPC Decoders", IEEE Transactions on Signal Processing, vol. 56, No. 11 (Nov. 2008).

Todd et al., "Enforcing maximum-transition-run code constraints and low-density parity check decoding", IEEE Trans. Magn., vol. 40, No. 6, pp. 3566-3571 (Nov. 2004).

U.S. Appl. No. 13/284,767, Unpublished (filed Oct. 28, 2011) (Fan Zhang).

U.S. Appl. No. 13/239,683, Unpublished (filed Sep. 22, 2011) (Changyou Xu).

U.S. Appl. No. 13/186,234, Unpublished (filed Jul. 19, 2011) (Haitao Xia).

U.S. Appl. No. 13/300,078, Unpublished (filed Nov. 18, 2011) (Chung-Li Wang).

U.S. Appl. No. 13/227,416, Unpublished (filed Sep. 7, 2011) (Lei Chen).

U.S. Appl. No. 13/213,751, Unpublished (filed Aug. 19, 2011) (Fan Zhang).

U.S. Appl. No. 13/305,551, Unpublished (filed Nov. 28, 2011) (Yang Han).

U.S. Appl. No. 13/296,022, Unpublished (filed Nov. 14, 2011) (Victor Krachkovsky).

U.S. Appl. No. 13/174,453, Unpublished (filed Jun. 30, 2011) (Johnson Yen).

U.S. Appl. No. 13/316,741, Unpublished (filed Dec. 12, 2011) (Yang Han).

U.S. Appl. No. 13/302,119, Unpublished (filed Nov. 22, 2011) (Lei Chen).

U.S. Appl. No. 13/227,544, Unpublished (filed Sep. 8, 2011) (Shaohua Yang).

U.S. Appl. No. 13/283,549, Unpublished (filed Oct. 27, 2011) (Wu Chang).

U.S. Appl. No. 13/305,510, Unpublished (filed Nov. 28, 2011) (Lei Chen).

(56) References Cited

OTHER PUBLICATIONS

U.S. Appl. No. 13/113,219, Unpublished (filed May 23, 2011) (Yang Han).

U.S. Appl. No. 13/180,495, Unpublished (filed Jul. 11, 2011) (Chung-Li Wang).

U.S. Appl. No. 13/295,150, Unpublished (filed Nov. 14, 2011) (Zongwang Li).

U.S. Appl. No. 13/316,858, Unpublished (filed Dec. 12, 2011) (Zongwang Li).

U.S. Appl. No. 13/284,730, Unpublished (filed Oct. 28, 2011) (Fan Zhang).

U.S. Appl. No. 13/269,852, Unpublished (filed Oct. 10, 2011) (Haitao Xia).

U.S. Appl. No. 13/174,537, Unpublished (filed Jun. 30, 2011) (Anantha Raman Krishnan).

U.S. Appl. No. 13/269,832, Unpublished (filed Oct. 10, 2011) (Haitao Xia).

U.S. Appl. No. 13/171,615, Unpublished (filed Jun. 29, 2011) (Bradley D. Seago).

Vasic, B., "High-Rate Low-Density Parity-Check Codes Based on Anti-Pasch Affine Geometries," Proc ICC 2002, pp. 1332-1336.

Vasic, B., "High-Rate Girth-Eight Codes on Rectangular Integer Lattices", IEEE Trans. Communications, vol. 52, Aug. 2004, pp. 1248-1252.

Weon-Cheol Lee et al., "Vitierbi Decoding Method Using Channel State Info. in COFDM System" IEEE Trans. on Consumer Elect., IEEE Service Center, NY, NY vol. 45, No. 3 Aug. 1999.

Yeo et al., "VLSI Architecture for Iterative Decoders in Magnetic Storage Channels", Mar. 2001, pp. 748-55, IEEE trans. Magnetics, vol. 37, No. 2.

Zhang et al., "Analysis of Verification-Based Decoding on the q-ary Symmetric Channel for Large q", IEEE Trans. On Information Theory, vol. 57, No. 10 (Oct. 2011).

Zhong et al., "Joint Code-Encoder Design for LDPC Coding System VLSI Implementation", ISCAS, IEEE pp. 389-392, May 2004.

Zhong et al., "High-Rate Quasi-Cyclic LDPC Codes for Magnetic Recording Channel with Low Error Floor", ISCAS, IEEE pp. 3546-3549, May 2006.

Zhong et al., "Quasi Cyclic LDPC Codes for the Magnetic Recording Channel: Code Design and VSLI Implementation", IEEE Transactions on Magnetics, v. 43, pp. 1118-1123, Mar. 2007.

Zhong et al., "Design of VLSI Implementation-Oriented LDPC Codes", IEEE, pp. 670-673, 2003.

Zhong, "Block-LDPC: A Practical LDPC Coding System Design Approach", IEEE Trans. On Circuits, Regular Papers, vol. 5, No. 4, pp. 766-775, Apr. 2005.

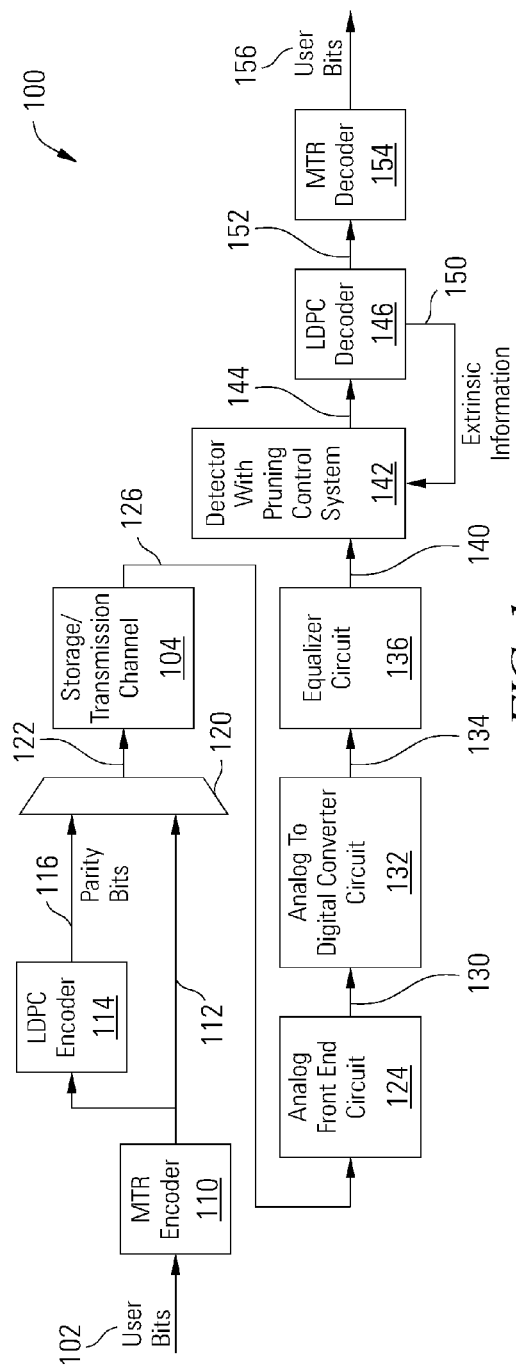
FIG. 1
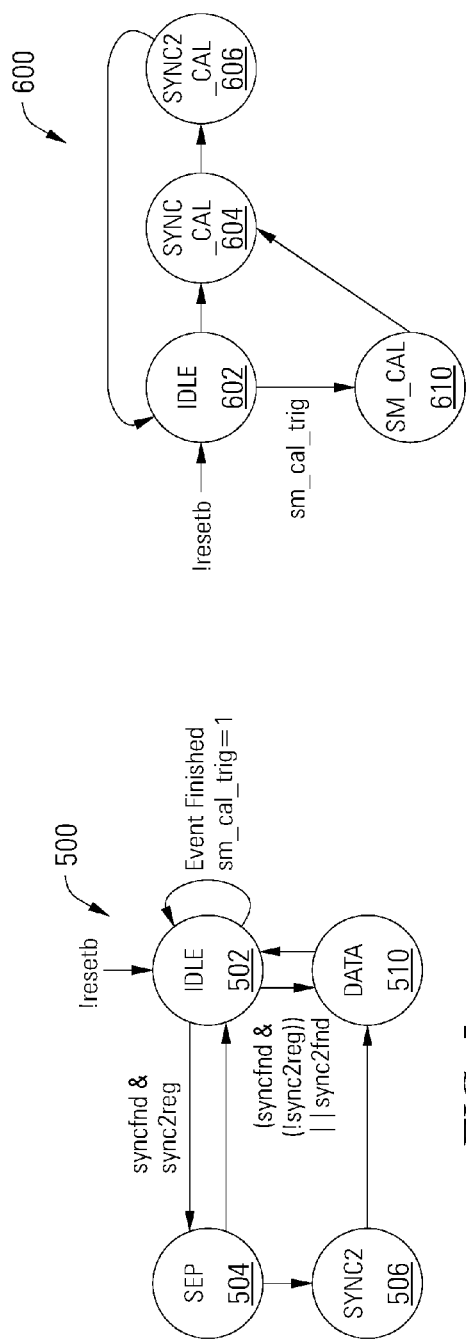
FIG. 6
FIG. 5

DETECTOR PRUNING CONTROL SYSTEM

BACKGROUND

Various products including hard disk drives utilize a read channel device to retrieve information from a medium and decode and convert the information to a digital data format. Such read channel devices may include data processing circuits including encoder, detector and decoder circuits to encode, detect and decode data as it is stored and retrieved from a medium or transmitted through a data channel, in order to reduce the likelihood of errors in the retrieved data.

It is important that the read channel devices be able to rapidly and accurately detect the data bits in retrieved or received data samples so they can be decoded. A number of various types of detectors are available to identify the value of encoded data bits as they are retrieved or received, before the detected data is decoded. One such detector is a maximum a posteriori (MAP) detector, which determines the most likely value of each encoded data bit. A typical MAP detector uses a trellis structure to calculate the probability or branch metric for each possible value of a bit or group of bits. A forward pass through the trellis is performed, calculating the probabilities of the possible values, a backward pass through the trellis is performed, again calculating the probabilities of the possible values, and the results of the forward and backward passes are combined to arrive at a decision based on the probabilities.

Because efforts are continually being made to increase the speed of data processing circuits while reducing their size and complexity, all while operating with increasingly dense storage devices or transmission channels that increase noise, there exists a need in the art for improving data detection in data processing circuits.

BRIEF SUMMARY

Various embodiments of the present invention provide apparatuses, systems and methods for data detection in a detector with a pruning control system. For example, a data detector is disclosed that includes a first set of counters operable to distinguish prunable data from non-prunable data in the data detector, a second set of counters operable to generate initial values for the first set of counters, and a prune control signal generator operable to generate a prune control signal based on the first set of counters. The second set of counters is operable to generate the initial values at least in part before a syncmark is detected in a data sector. The initial values are used to initialize the first set of counters when the syncmark is detected in the data sector. The prune control signal controls whether the data detector is allowed to prune a trellis. Some embodiments include a third set of counters operable to generate second initial values for the first set of counters, and a fourth set of counters operable to generate ending values for the first set of counters. The third set of counters generates the second initial values at least in part before a second syncmark is detected in the data sector. The second initial values are used to initialize the first set of counters when the second syncmark is detected in the sector. The ending values are used for the first set of counters when a data fragment being processed in the data detector ends before the second syncmark is detected.

Other embodiments provide a method of detecting data in a data detector with a pruning control system, including calculating initial values for a first set of counters using a second set of counters while searching for a syncmark in a sector of data, calculating second initial values for the first set of counters using a second set of counters while searching for a second syncmark in the sector of data, when the syncmark is detected, initializing the first set of counters with the initial values, and when the second syncmark is detected, initializing the first set of counters with the second initial values, and generating a prune control signal based on the first set of counters. Some instances of the aforementioned embodiments also include calculating ending values for the first set of counters for use when a data fragment is completed before the syncmark or the second syncmark are detected.

This summary provides only a general outline of some embodiments according to the present invention. Many other objects, features, advantages and other embodiments of the present invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals may be used throughout several drawings to refer to similar components. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

FIG. 1 depicts a block diagram of a read channel including a detector with a pruning control system which may be used to store and retrieve or transmit and receive data in accordance with various embodiments of the present invention;

FIG. 5 depicts a state diagram used to select one of the three groups of counters of FIG. 4 in accordance with various embodiments of the present invention;

FIG. 6 depicts a state diagram used to calculate values for the three groups of counters of FIG. 4 in accordance with various embodiments of the present invention;

DETAILED DESCRIPTION OF THE INVENTION

Figure 2:
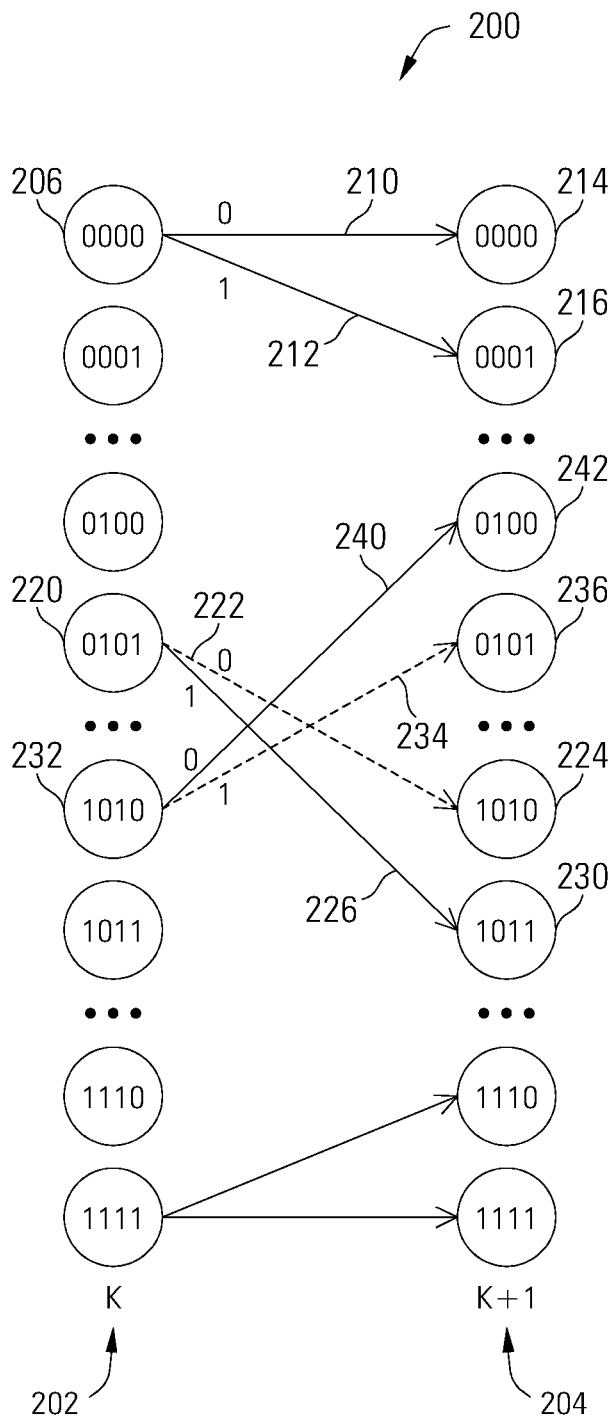
FIG. 2 depicts a trellis diagram illustrating branch metric probabilities in transitions between states in accordance with various embodiments of the present invention.

Various embodiments of the present invention provide apparatuses, systems and methods for data detection in a detector with pruning. The detector may comprise any channel detector or data detector which calculates branch metrics or probabilities for transitions between states relating to data bit values, and which prunes branches corresponding to forbidden data patterns. The detector may comprise, but is not limited to, a soft output Viterbi algorithm (SOVA) or maximum a posteriori (MAP) detector in which forward and backward recursions are performed in a trellis of data states. A trellis implemented by a detector with soft pruning can have any number of states, including a 2-state trellis that calculates transitions between single-bit values, or a 16-state trellis with four-bit values, or any other number of states.

In certain operating environments, the probability that data transitions take particular branches is affected by constraints imposed on the data by other data processing elements. For example, when the detector processes data encoded by a maximum transition run (MTR) encoder, some data patterns are prohibited by the constraints imposed by the MTR encoder. MTR encoders may be used in environments such as high density magnetic recording, in which long transition runs can cause significant burst errors. An MTR encoder applies a constraint which limits the number of consecutive transitions in a stream of data bits in the non-return to zero (NRZ) domain. An MTR(3) encoder limits the data stream to three consecutive transitions between bits of opposite state. The MTR(3) encoder will not produce a stream of data bits with four consecutive transitions, or five consecutive different values.

Constraints such as this affect the likelihood of certain branches or paths through the trellis in the detector. These forbidden branches may be pruned by biasing the branch metrics in the detector. A pruning control system is used to generate one or more prune control signals which enable and disable pruning in the detector, for example enabling and disabling application of branch metric offsets or biases to forbidden branches in the detector. The pruning control system considers channel conditions that affect the channel data and the detection process. For example, the MTR constraint imposed by the encoder may be affected or violated by parity bits inserted after the encoding process or by other formatting data inserted into the encoded data such as parity bits, sync patterns, headers, etc. The pruning control system discontinues pruning in response to these environmental conditions, for example turning off the pruning operation when processing parity bits or encoded bits adjacent parity bits where the MTR constraint that was used to generate the branch metric offsets are or may be violated. The pruning control system uses counters to distinguish data which may be pruned in the detector from data which should not be pruned.

The detector pruning control system disclosed herein is not limited to use with any particular type of detector, or with any particular pruning scheme. The detector pruning control system identifies when pruning may take place in the detector, activating and deactivating pruning so that efficiency can be increased by pruning without introducing errors by improperly pruning, such as when any of the data bits being detected contain LDPC parity bits or are in a preamble, address mark or post-amble.

Although the detector with pruning disclosed herein is not limited to any particular application, it may be used in a read channel of a storage device. Turning to FIG. 1, a read channel 100 is used to process user data bits 102, and store them in or transit them through a storage or transmission channel 104 and retrieve the user data bits 156 without introducing errors. The user data bits 102 are processed in an MTR encoder 110, an enumerative encoder which limits maximum transition run length. The frequency response of the read channel 100 is generally at a maximum at DC and degrades near the Nyquist frequency, particularly when the storage or transmission channel 104 is a magnetic storage device. By limiting the maximum transition run length in the encoded user bits 112, the read channel 100 operates below the Nyquist frequency and avoids errors that might be introduced by the degraded frequency response near the Nyquist frequency.

The encoded user bits 112 are provided to a low density parity check (LDPC) encoder 114, which produces parity bits 116 for the encoded user bits 112. The parity bits 116 are combined with the encoded user bits 112 in a multiplexer 120. The resulting digital data stream 122 may be manipulated before storage or transmission in storage or transmission channel 104. For example, the digital data stream 122 may be converted to analog format and modulated or otherwise processed before it used to drive a magnetic write head or to be transmitted as a radio frequency signal or other wired or wireless signal.

The read channel 100 includes an analog front end circuit 124 that receives and processes an analog signal 126 from the storage or transmission channel 104. Analog front end circuit 124 may include, but is not limited to, an analog filter and an amplifier circuit as are known in the art. Based upon the disclosure provided herein, one of ordinary skill in the art will recognize a variety of circuitry that may be included as part of analog front end circuit 124. In some cases, the gain of a variable gain amplifier included as part of analog front circuit 124 may be modifiable, and the cutoff frequency and boost of an analog filter included in analog front end circuit 124 may be modifiable. Analog front end circuit 124 receives and processes the analog signal 126, and provides a processed analog signal 130 to an analog to digital converter circuit 132. In some cases, analog signal 126 is derived from a read/write head assembly in the storage or transmission channel 104 that is disposed in relation to a storage medium. In other cases, analog signal 126 is derived from a receiver circuit in the storage or transmission channel 104 that is operable to receive a signal from a transmission medium. The transmission medium may be wireless or wired such as, but not limited to, cable or optical connectivity. Based upon the disclosure provided herein, one of ordinary skill in the art will recognize a variety of sources from which analog input 126 may be derived.

Analog to digital converter circuit 132 converts processed analog signal 130 into a corresponding series of digital samples 134. Analog to digital converter circuit 130 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 134 are provided to an equalizer circuit 136. Equalizer circuit 136 applies an equalization algorithm to digital samples 134 to yield an equalized output 140. In some embodiments of the present invention, equalizer circuit 136 is a digital finite impulse response filter circuit as are known in the art. Equalized output 140 is provided to a data detector circuit 142. In some cases, equalizer 136 includes sufficient memory to maintain one or more codewords until a data detector circuit 142 is available for processing.

The data detector circuit 142 performs a data detection process on the received input from the storage or transmission channel 104 resulting in a detected output 144. The detected output 144 is provided to a decoder such as an LDPC decoder 146 which performs parity checks on the detected output 144, ensuring that parity constraints established by the LDPC encoder 114 are satisfied in order to detect and correct any errors that may have occurred in the data while passing through the storage or transmission channel 104 or other components of the read channel 100. Other error detection and correction encoders and decoders may be used in the read channel 100 in place of the LDPC encoder 114 and LDPC decoder 146, and one of ordinary skill in the art will recognize a variety of error detection and correction encoders and decoders that may be used in relation to different embodiments of the present invention. In the case of the LDPC encoder 114 and LDPC decoder 146, the data detector circuit 142 and LDPC decoder 146 may operate in an iterative fashion, with extrinsic information 150 passed from the LDPC decoder 146 to the data detector circuit 142 to aid in the data detection and parity check process. The LDPC decoder 146 yields encoded user bits 152 retrieved from the storage or transmission channel 104, with the parity bits removed after the combination of encoded user bits and parity bits satisfy the parity check constraints.

The encoded user bits 152 from the LDPC decoder 146 are provided to an MTR decoder 154 which reverses the enumerative encoding performed by the MTR encoder 110. The MTR decoder 154 yields user data bits 156, which should be identical to user data bits 102 if the data is not corrupted in the storage or transmission channel 104 beyond the capacity of the data detector circuit 142 and LDPC decoder 146 to correct.

Data detector circuit 142 is operable to apply a data detection algorithm to a received codeword or data set, and in some cases data detector circuit 142 can process two or more codewords in parallel. The received codeword or data set includes a number of multi-bit symbols. In one particular embodiment of the present invention, the multi-bit symbols are four bit symbols that may take one of sixteen possible values for each four bit symbol (i.e., '0000', '0001', '0010', . . . '1111'). In such a case, a detected output 144 from data detector circuit 142 includes sixteen soft decision values (L0 corresponding to a likelihood that '0000' is the appropriate hard decision, L1 corresponding to a likelihood that '0001' is the appropriate hard decision, L2 corresponding to a likelihood that '0010' is the appropriate hard decision, and so on to L16 which corresponds to a likelihood that '1111' is the appropriate hard decision). In other embodiments of the present invention, the multi-bit symbols are two or three bit symbols or symbols of other widths. Based upon the disclosure provided herein, one of ordinary skill in the art will recognize a number of different symbol sizes that may be used in relation to different embodiments of the present invention.

In some embodiments of the present invention, data detector circuit 142 is a soft output Viterbi algorithm (SOVA) data detector circuit as is known in the art. In other embodiments of the present invention, data detector circuit 142 is a maximum a posteriori data detector circuit as is known in the art. Of note, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention. Data detector circuit 142 is started based upon availability of a data set from equalizer circuit 136 or other source.

An example MAP detector that may benefit from soft pruning implements the Bahl-Cocke-Jelinek-Raviv (BCJR) algorithm, performing forward and reverse recursions through a trellis of states, calculating the likelihood of each path between states in both the forward and reverse recursions, then combining the results. The MAP detector may yield a soft output, the likelihood of each bit or symbol, or may yield hard decisions, the value of each bit or symbol.

Turning to FIG. 2, a trellis diagram 200 is shown illustrating branch metric probabilities in transitions between states at time k 202 and time k+1 204. In the trellis diagram 200 of FIG. 2, at time k 202 illustrated in the left column, each state (e.g., 206) has a four bit value. (E.g., '0000') Between time k 202 and time k+1 204, another bit is received and is added to the right-most end of the value, with the left-most bit from time k 202 dropping off. For example, state 206 has two possible transitions 210 and 212. If a '0' bit is received, taking transition path 210, state 206 is followed by state 214, still with value '0000'. If a '1' bit is received, taking transition path 212, state 206 is followed by state 216 with value '0001'.

If the data processed by the detector is encoded by an MTR(3) encoder, certain data patterns are prohibited in encoded user data to limit the maximum transition run length and zero-run length. For example, from state 220 at time k having value '0101', the receipt of a '0' along transition path 222 would be a run of four consecutive transitions, '01010', which is prohibited by a "j-constraint" and will not be produced by the MTR(3) encoder. Thus, the probability of transition 222 between states 220 and 224 is zero. As a result, the probability of receiving a '1' and taking transition 226 between states 220 and 230 with value '1011' is one, or one hundred percent. Similarly, from state 232 at time k with value '1010', the receipt of a '1' along transition path 234 would be a run of four consecutive transitions, '10101', which is prohibited and will not be produced by the MTR(3) encoder. Thus, the probability of transition 234 between state 232 at time k and state 236 is zero. As a result, the probability of receiving a '0' and taking transition 240 between states 232 and 242 with value '0100' is one, or one hundred percent. In some embodiments, a "k-constraint" in the MTR(3) encoder prevents five consecutive '0' values, and thus transition 210 should not occur and may be pruned if all five bits are within a prunable region such as user data.

Transitions 222 and 234 may be pruned in the detector by calculating branch metric offsets and combining them with the branch metric calculations in add/square blocks of a detector for transitions 222 and 234 that reduce the overall likelihood or probability for those transitions or branches to zero. The probabilities for transitions 226 and 240 are also modified by calculating and combining branch metric offsets for them that increase the overall likelihood or probability for those transitions or branches to one. Thus, the detector with soft pruning applies branch metric offsets for states associated with prohibited transitions. Other branch metrics may also be modified according to the pruning algorithm implemented, when enabled by the pruning control system.

The pruning is selectively activated and deactivated in the data detector by the pruning control system based on the content or format of the incoming data. Turning back to FIG. 1, although the conditional state transition probabilities may be based on a single component such as the MTR encoder 110 or upon a single mode of operation in a read channel 100, these conditional state transition probabilities may be affected by other components or modes of operation, such as the parity bits 116 generated by LDPC encoder 114 and inserted in the encoded user bits 112 by multiplexer 120.

Figure 3:
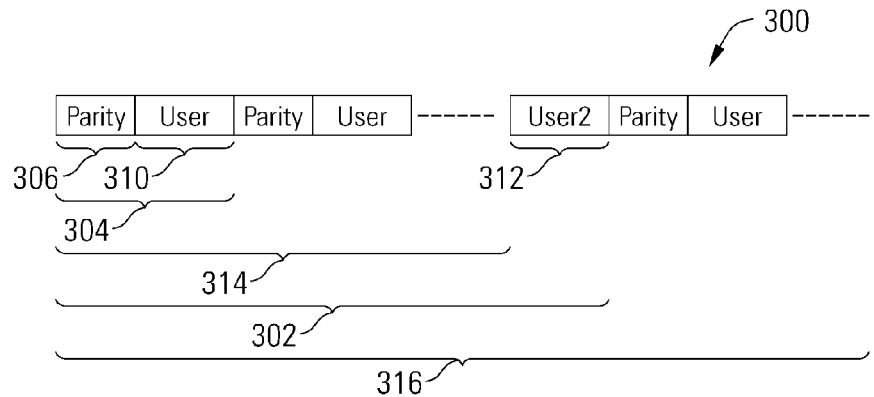
FIG. 3 depicts a diagram of a sector format showing codewords including user bits and parity bits in accordance with various embodiments of the present invention.

Turning to FIG. 3, a diagram of a sector format showing codewords including user bits and parity bits is illustrated in accordance with various embodiments of the present invention. Notably, the sector format of FIG. 3 is merely an example illustration, and the pruning control system may be adapted to any data format to distinguish between prunable data and non-prunable data. In this particular embodiment, the pruning control system includes a J counter and a K counter to represent a current data bits position in a codeword, used to determine whether the current data bit is a user data bit or a parity bit (not to be confused with the j-constraint and k-constraint applied by the MTR encoder 110). The determination of whether a current data bit is a user data bit or a parity bit is used to generate one or more prune control signals to enable and disable pruning in the detector. A sector 300 includes several codewords. Each codeword (e.g., 302) includes repeat_num successive parity+user patterns (e.g., 304), each including a parity block (e.g., 306) of parity bits such as LDPC parity bits and a user block (e.g., 310) of MTR encoded user data bits, followed by a user2 block 312. Notably, the blocks in sector 300 are not drawn to scale in FIG. 3. The first data bit in the sector is an LDPC parity bit in the parity block 306. The length of each parity block (e.g., 306) is denoted as parityLen, the length of each user block (e.g., 310) is denoted as userLen. The length of a parity_user pattern (e.g., 304) is PatternLen=parityLen+userLen. The length of the succession 314 of parity_user patterns (e.g., 304) is (parityLen+userLen)*repeat_num. The length of the user2 block 312 is user2Len. The length of the codeword is thus cwLen= (parityLen+userLen)*repeat_num+user2Len. The sector 300 includes a succession of codewords until the sector is completed and a sectorLen 316 is reached. Notably, FIG. 3 shows only user data and parity bits which affect the counters in the pruning control system to keep the illustration of data affecting counters in the pruning control system clear. The sector 300 also includes formatting data which are not shown in FIG. 3, such as a preamble and first syncmark before the first parity block 306, and a second syncmark before the user2 block 312.

The J counter represents the current data's position in a codeword. J rolls over or is reset when it reaches cwLen, and may be represented as j=(intervalCount−1)%cwLen, where intervalCount is incremented by 1 for each 12 bit data block received. The K counter represents the current data's position in the parity+user pattern (e.g., 304). The K counter rolls over or is reset when it reaches PatternLen, and may be represented as k=j%PatternLen. Using j and k, the pruning control system can determine whether a current data bit or symbol is a parity bit or user data.

In the example embodiment, parityLen, userLen and userLen2 are in units of 12, meaning that if parityLen is 1, the parity block (e.g., 306) contains 12 bits or symbols. The example detector processes 4 bits or symbols (referred to herein as a nibble) per clock cycle, so 3 clock cycles are used to process 12 bits or symbols. A cycle_cnt counter counts clock cycles from 0 to 2, rolling over before exceeding 2. Thus, when cycle_cnt reaches 2, 12 data bits or symbols have been received, and the J and/or K counters are incremented. The J and K counters may be realized using a nibbleCount counter that is used to count all incoming data nibbles for the sector, starting from 1 for the first data nibble in the first fragment, although it is not incremented in formatting fields such as the preamble, first and second syncmark fields and the postamble used in sector formatting for a magnetic hard drive. In the example embodiment, a data fragment is a portion of a sector, including a preamble, syncmark, and data with user data bits and parity bits. A SERVO field separates fragments in the sector. The nibbleCount counter is incremented as each 4-bit data nibble is received, excluding preamble and syncmark data, starting with the first data nibble in the first fragment of the sector and continuing to count data nibbles across multiple fragments over the entire sector. An intervalCount is defined as ceiling(nibbleCount/3). Thus intervalCount is incremented by one for each 12 bit data block received. Pseudo-code for generating a prune control signal using the j and k counters based on the intervalCount counter is set forth below:

```
int pruneUserSymbol(int intervalCount, int valid)
{
    int j,k;
    int userSymbol;
    userSymbol=0;
    // don't prune when not valid
    if(valid) {
        // prune when valid but not over parity bits
        j=((intervalCount−1)%cwLen);
        if(j>=cwLen−userLen2)
            userSymbol=1; // in user2 block
        else{
            k=(j%PatternLen);
            if(k>=parityLen)
                userSymbol=1; // in user block
            else
                userSymbol=0; // in parity block
        }
    }
    return(userSymbol);
}
```

In summary, the cycle_cnt counter counts from 0 to 2. When 4 data bits or symbols are entered, cycle_cnt is incremented by one. When cycle_cnt is at 2 and 4 data bits or symbols are entered, cycle_cnt rolls over to 0 and the J counter is incremented, with the J counter counting from 0 to (cwLen−1). The K counter counts from 0 to (patternLen−1), incrementing when cycle_cnt rolls over to 0 and only when the J counter<cwLen−userLen2.

Figure 4:
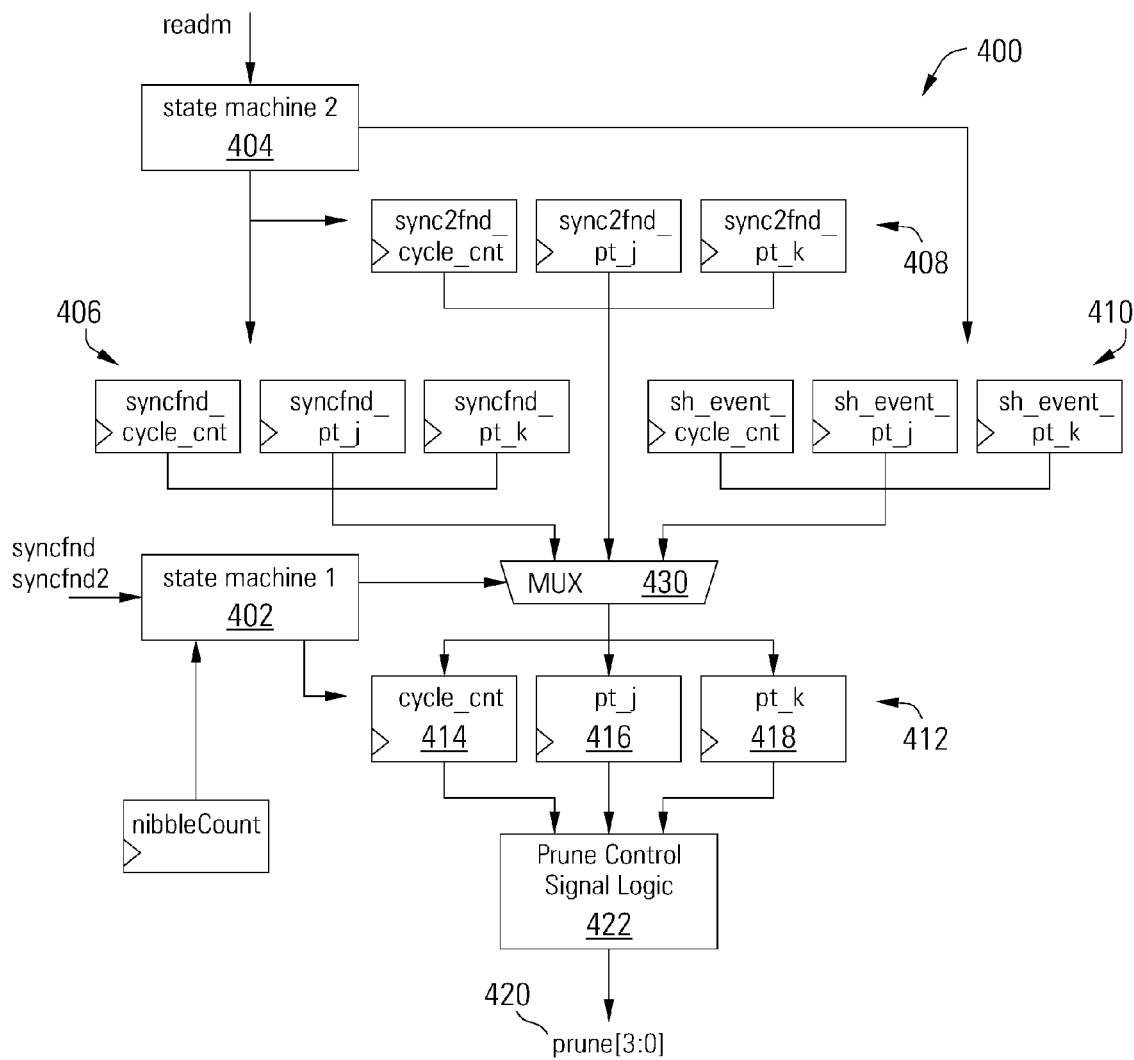
FIG. 4 depicts a block diagram illustrating a set of counters used to generate a prune control signal and three groups of counters used to generate initial or ending values for the set of counters in various system states in accordance with various embodiments of the present invention.

As disclosed above, the sector 300 includes formatting data which are not shown in FIG. 3, such as a preamble and first syncmark before the first parity block 306, and a second syncmark before the user2 block 312. A first syncmark found signal (syncfnd) and a second syncmark found signal (sync2fnd) are used in the detector to indicate when valid data is being sent to the first MAP block in the detector. However, these signals have a latency of M clock cycles. This means that when syncfnd and sync2fnd are asserted, M MTR data have already been sent to the first MAP block in the detector, and the counters in the pruning control system would be behind. The pruning control system thus pre-calculates the starting position value of the counters for when the syncfnd and sync2fnd signals are asserted. Thus, when syncfnd or sync2fnd is asserted, intervalCount jumps to the correct pre-calculated value. This calculation may be performed while the preamble field is being processed to reduce latency. Similarly, the pruning control system uses a SERVO field time to calculate a very short fragment's ending position value. The detector uses the intervalCount counter along with pruning parameters programmed into a SIF register to calculate prune signals, with parameters such as:

parityLen, the parity pattern length, during which pruning is disabled
  userLen, the user pattern length, pruning enabled
  repeat_num, the number of times the parity+user pattern repeats before user2
  userLen2, the user 2 length, pruning enabled Turning to FIG. 4, a block diagram 400 illustrates the use of first and second state machines 402 and 404 to control the calculation and usage of a cycle_cnt, J and K counters for various conditions. FIG. 4 illustrates the selection of different counter groups and the origin of pre-calculated counter values based on system state, and does not show the clock inputs actually being counted, because the counting operation for the cycle_cnt, J and K counters has been disclosed above. Three sets 406, 408 and 410 of cycle_cnt, J and K counters are used in the example embodiment of FIG. 4 to calculate initial values for a main set 412 of counters. The main set 412 of counters includes a cycle_cnt counter 414, used to track 12 bit input groups and increment a pt_j counter 416 or J counter and a pt_k 418 or K counter, used to generate a prune control signal 420 in prune control signal logic 422. Again, the pruning control system is not limited to use with any particular pruning scheme, and the details of the prune control signal logic 422 will therefore not be given. In one example embodiment, the prune control signal logic 422 includes logic gates that enable the prune control signal 420 when all of the bits related to a state transition in the detector trellis are user data bits, and that disable the prune control signal 420 when one or more of the bits are parity bits or other formatting bits, where the prune control signal 420 allows the detector to apply branch metric offsets to the branch metrics for the state transition to prune the state transition.

The first set 406 of cycle_cnt, J and K counters is used to generate initial counter values for the main set 412 of counters when syncfnd is asserted. The second set 408 of cycle_cnt, J and K counters is used to generate initial counter values for the main set 412 of counters when sync2fnd is asserted. The third set 410 of cycle_cnt, J and K counters is used to generate ending values for the main set 412 of counters for a short data event, or a data event which ends before the M clock cycle latency completes. The first state machine 402 controls a multiplexer 430 to copy values from one of the three sets 406, 408 and 410 of cycle_cnt, J and K counters to the main set 412 of counters, based on the syncfnd and sync2fnd signals which indicate that the first syncmark or second syncmark has been found in the sector, and on a nibbleCount counter that identifies a short data event.

Again, because of the latency of the syncfnd and sync2fnd signals, the initial values for cycle_cnt 414, pt_j 416 and pt_k 418 are calculated, using one of the three sets 406, 408 and 410 of cycle_cnt, J and K counters to generate the initial values by counting clock cycles. The main set 412 of counters is used during the detection process to identify which trellis branches may be pruned (e.g., those containing only user data bits) and which trellis branches may not be pruned (e.g., those containing some or only parity bits and/or formatting bits). This is accomplished by counting data nibbles with the nibbleCount and data intervals with intervalCount, and using those counters to update one or more of the three sets 406, 408 and 410 of cycle_cnt, J and K counters as disclosed in the pseudocode above before or as the data is processed in the detector. However, because of the latency of the syncfnd and sync2fnd signals, the main set 412 of counters cannot start counting at the beginning of the user data in each fragment. To avoid having to delay the initialization of the detector and the beginning of the detection process until after the syncfnd or sync2fnd signals are asserted, one of sets 406 and 408 of cycle_cnt, J and K counters are used to count clock cycles before either the syncfnd or sync2fnd signal, respectively, is asserted. Once either the syncfnd or sync2fnd signal is asserted, the corresponding counts are copied from set 406 or 408 of cycle_cnt, J and K counters to the main set 412 of counters, enabling the main set 412 of counters to continue counting data from that point on to track whether data contains user data or parity/formatting data. In some instances, the third set 410 of cycle_cnt, J and K counters is used to determine the ending value for the main set 412 of counters, when the fragment ends before the sync2fnd signal is asserted. For short fragments such as these, they will have passed before the sync2fnd signal is asserted, so the third set 410 of cycle_cnt, J and K counters provides the ending value for the main set 412 of counters for the short fragment. (In some embodiments, short fragments may also occur after the first syncmark, in which cases the third set 410 of cycle_cnt, J and K counters may also be used to calculate the ending value when the syncfnd is asserted after a short fragment.) Given these initial values and ending value, the main set 412 of counters can be used when processing the data in the detector to determine whether transitions in the detector trellis can be pruned for particular bit sequences. The counting in the three sets 406, 408 and 410 of cycle_cnt, J and K counters is initiated at a time that will provide correct values when transferred to the main set 412 of counters after the syncfnd or sync2fnd signal is asserted.

Turning to FIG. 5, a state diagram 500 used in a state machine to select one of the three sets 406, 408 and 410 of cycle_cnt, J and K counters is illustrated in accordance with various embodiments of the present invention. The state machine implementing state diagram 500 is suitable for use in place of the first state machine 402 of FIG. 4 in some embodiments. The state diagram 500 has an IDLE state 502, SEP state 504, SYNC2 state 506 and DATA state 510. The state diagram 500 bases the state transitions on a number of control signals and registers. A syncfnd signal is asserted when the first syncmark is detected, and a sync2fnd signal is asserted when the second syncmark is detected. A sync2reg register is configured in advance, indicating whether the sector will contain a second syncmark. A !resetb signal resets the state diagram 600 before operation. The nibbleCount counter is used to determine when a data fragment is shorter than normal.

When the syncfnd signal is asserted, indicating that the first syncmark is found, and the sync2reg register is set to indicate that the sector contains a second syncmark, the state diagram 500 transitions from IDLE state 502 to SEP state 504. There are a known number of bits between the first and second syncmarks, therefore, after a predetermined number of clock cycles has passed, the state diagram 500 transitions from SEP state 504 to SYNC2 state 506, unless the data fragment between the first and second syncmarks is shorter than the known number of bits, in which case the state diagram 500 transitions from SEP state 504 to IDLE state 502. If the state diagram 500 does transition from SEP state 504 to SYNC2 state 506, after another number of clock cycles has passed, the state diagram 500 transitions from SYNC2 state 506 to DATA state 510. After all data has been provided to the detector, the state diagram 500 transitions from DATA state 510 to IDLE state 502. If the data event is short, after syncfnd or sync2fnd is asserted, the fragment has finished and the state diagram 500 will stay in IDLE state 502, and will trigger the calculation of ending values in the third set 410 of cycle_cnt, J and K counters.

If the state diagram 500 is in the IDLE state 502 and syncfnd is asserted with the sync2reg indicating that the sector does not contain a second syncmark, or if sync2fnd is asserted, the state diagram 500 transitions from the IDLE state 502 to DATA state 510. After all data has been provided to the detector, the state diagram 500 transitions back from DATA state 510 to IDLE state 502.

Turning to FIG. 6, a state diagram 600 used in a state machine to calculate values for the three sets 406, 408 and 410 of cycle_cnt, J and K counters is illustrated in accordance with various embodiments of the present invention. The state machine implementing state diagram 600 is suitable for use in place of the second state machine 404 of FIG. 4 in some embodiments. The state diagram 600 has an IDLE state 602, SYNC_CAL state 604, SYNC2_CAL state 606, and SM_CAL state 610. The state diagram 600 bases the state transitions on a number of control signals and registers. A READM signal is asserted at the beginning of a sector at the start of the preamble and first syncmark and is de-asserted at the end of the sector after any padding bits. A syncfnd signal is asserted when the first syncmark is detected, and a sync2fnd signal is asserted when the second syncmark is detected. A !resetb signal resets the state diagram 600 before operation.

The state diagram 600 transitions from IDLE state 602 to SYNC_CAL state 604 when a positive edge is detected on the READM signal, if the sync2reg is set. In the SYNC_CAL state 604, the pruning control system calculates the value of the first set 406 of cycle_cnt, J and K counters, used as initial counter values for the main set 412 of counters when syncfnd is asserted. In some embodiments, the first set 406 of cycle_cnt, J and K counters count only in the SYNC_CAL state 604, taking 18 clock cycles. At this stage, it is unknown whether the first syncmark or second syncmark is used, so the state diagram 600 transitions from SYNC_CAL state 604 to SYNC2_CAL state 606 to calculate the value of the second set 408 of cycle_cnt, J and K counters, used as initial counter values for the main set 412 of counters when sync2fnd is asserted, with the second set 408 of counters counting only in SYNC2_CAL state 606. This takes either 28 or 90 cycles, depending on the format of the second syncmark, in some embodiments. While in SYNC2_CAL state 606, if it is determined that the first syncmark is currently being processed, the state diagram 600 transitions back to IDLE state 602. When the syncfnd or sync2fnd signals are asserted after the M clock cycle latency, the first state machine 402 selects the values from either the first set 406 of cycle_cnt, J and K counters or the second set 408 of cycle_cnt, J and K counters as the initial counter values for the main set 412 of counters. When the fragment is very small, that is when sync2fnd is asserted, the fragment will have finished loading to the detector by the time sync2fnd is asserted. In other words, the fragment length is smaller than the M clock cycle latency required to assert the sync2fnd signal. In this case, the state diagram 600 transitions from IDLE state 602 to SM_CAL state 610 to calculate the ending values for the main set 412 of counters using the third set 410 of cycle_cnt, J and K counters according to the fragment length. The signals used to trigger state transitions in the state diagram 600 may be adapted to the particular design of the detector. For example, in some embodiments a the state diagram 600 transitions based on the READM signal to start the counting in the SYNC_CAL state 604 and on a sm_cal_trig signal indicating that the fragment is short and triggering the SM_CAL state 610, during which the third set 410 of cycle_cnt, J and K counters are actively counting.

Figure 7:
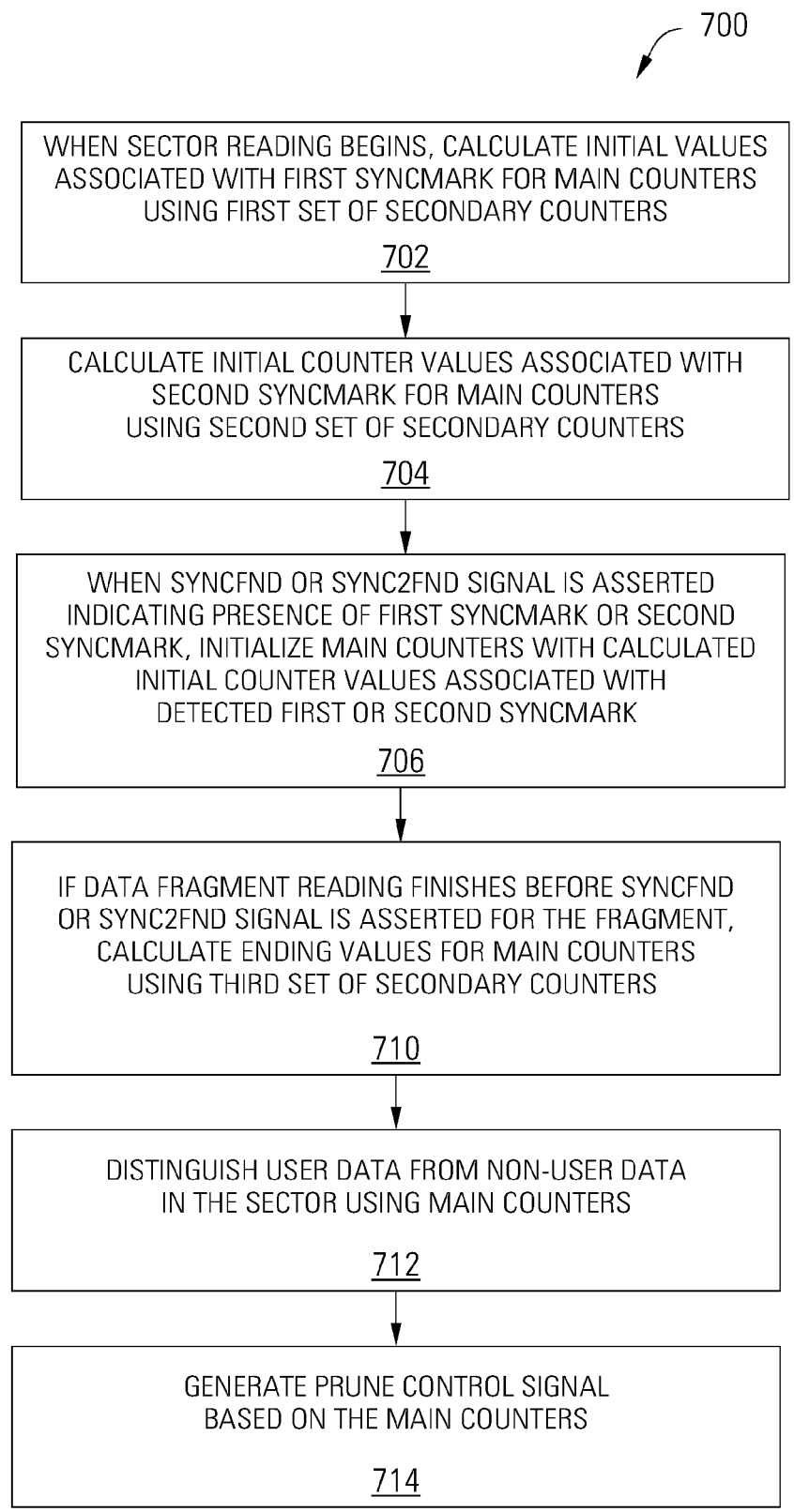
FIG. 7 depicts a flow diagram showing a method for generating a prune control signal in accordance with various embodiments of the present invention.

Turning to FIG. 7, a flow diagram 700 depicts a method for generating a prune control signal in accordance with various embodiments of the present invention. The method of FIG. 7, or variations thereof, may be performed in detector pruning control systems such as those illustrated in FIGS. 4-6. Following flow diagram 700, initial counter values associated with first syncmark are calculated when sector reading begins using a first set of secondary counters, such as set 406 of cycle_cnt, J and K counters. (Block 702) Initial counter values associated with second syncmark are calculated using a second set of secondary counters, such as set 408 of cycle_cnt, J and K counters. (Block 704) In some embodiments, if the first syncmark is found while the initial counter values associated with the second syncmark are still being calculated, the calculation of the initial counter values asso- ciated with the second syncmark is cancelled when the first syncmark is detected, or when syncfnd is asserted. When a syncfnd or sync2fnd signal is asserted indicating the presence of first syncmark or secondsync mark, the main counters are initialized with the calculated initial counter values associated with the appropriate first or second syncmark. (Block 706) For example, if sync2fnd is asserted, the main counters are initialized from the second set of secondary counters, such as set 408 of cycle_cnt, J and K counters. If data fragment reading finishes before syncfnd or sync2fnd signal is asserted for the fragment, ending values for the main counters are calculated using third set of secondary counters, such as the third set 410 of cycle_cnt, J and K counters. (Block 710) User data is distinguished from non-user data using the main counters. (Block 712) This may be accomplished, for example, using J and K counters 416 and 416 to track the position of parity and user blocks (e.g., 306 and 310). At least one prune control signal is generated based on the main counters, for example in prune control signal logic 422.

Figure 8:
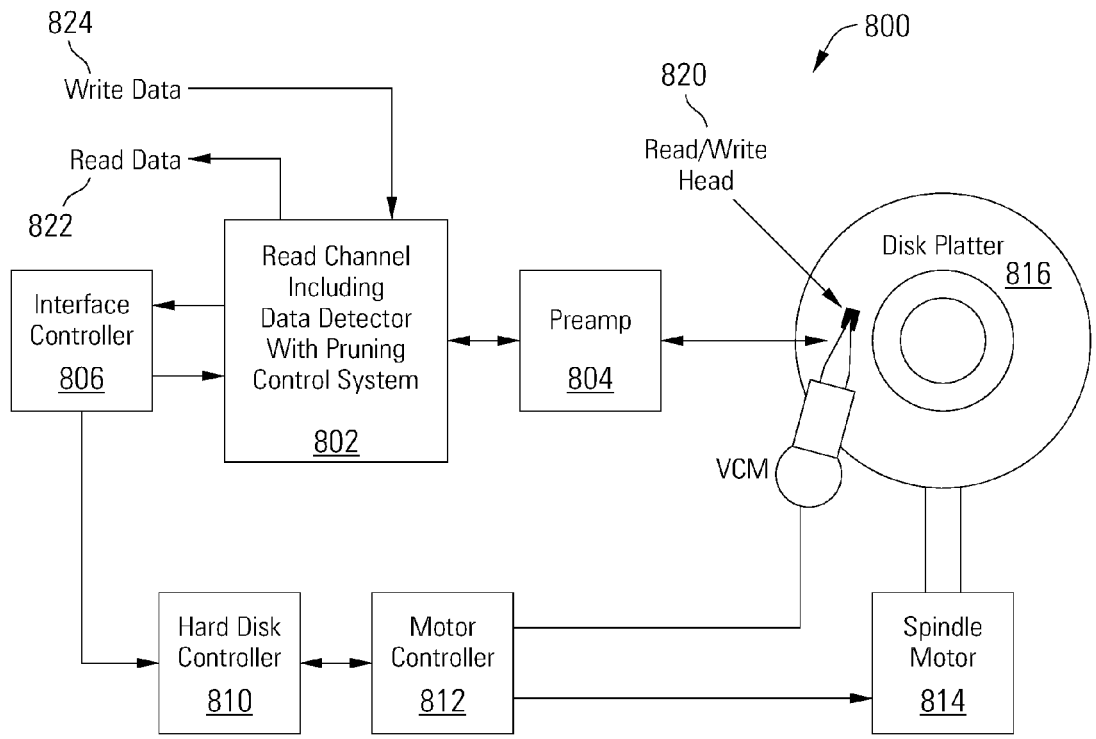
FIG. 8 depicts a storage system including a detector with a pruning control system in accordance with some embodiments of the present invention.
Figure 9:
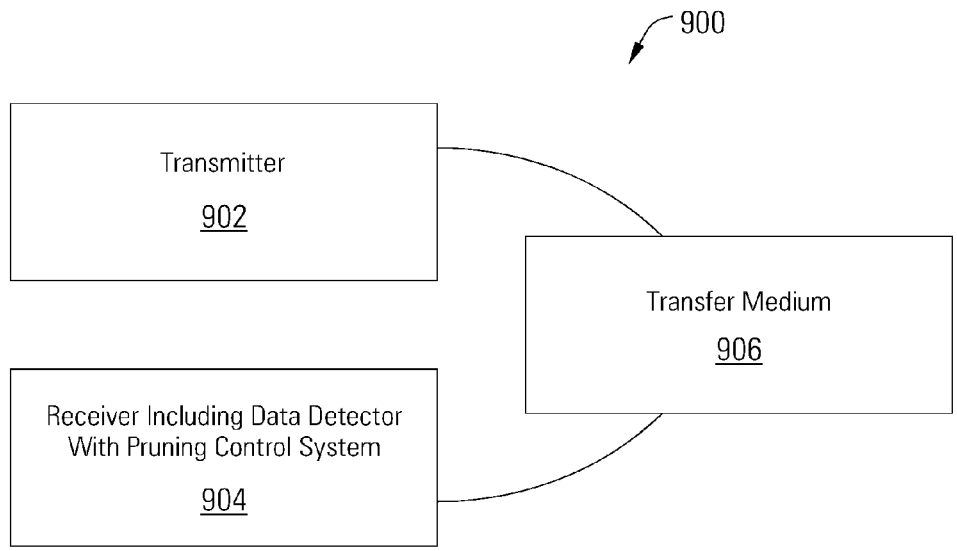
FIG. 9 depicts a wireless communication system including a detector with a pruning control system in accordance with some embodiments of the present invention.

Although the data detector with pruning control system disclosed herein is not limited to any particular application, several examples of applications are presented in FIGS. 8 and 9 that benefit from embodiments of the present invention. Turning to FIG. 8, a storage system 800 is illustrated as an example application of a data detector with pruning control system in accordance with some embodiments of the present invention. The storage system 800 includes a read channel circuit 802 with a data detector with pruning control system in accordance with some embodiments of the present invention. Storage system 800 may be, for example, a hard disk drive. Storage system 800 also includes a preamplifier 804, an interface controller 806, a hard disk controller 810, a motor controller 812, a spindle motor 814, a disk platter 816, and a read/write head assembly 820. Interface controller 806 controls addressing and timing of data to/from disk platter 816. The data on disk platter 816 consists of groups of magnetic signals that may be detected by read/write head assembly 820 when the assembly is properly positioned over disk platter 816. In one embodiment, disk platter 816 includes magnetic signals recorded in accordance with either a longitudinal or a perpendicular recording scheme.

In a typical read operation, read/write head assembly 820 is accurately positioned by motor controller 812 over a desired data track on disk platter 816. Motor controller 812 both positions read/write head assembly 820 in relation to disk platter 816 and drives spindle motor 814 by moving read/write head assembly 820 to the proper data track on disk platter 816 under the direction of hard disk controller 810. Spindle motor 814 spins disk platter 816 at a determined spin rate (RPMs). Once read/write head assembly 820 is positioned adjacent the proper data track, magnetic signals representing data on disk platter 816 are sensed by read/write head assembly 820 as disk platter 816 is rotated by spindle motor 814. The sensed magnetic signals are provided as a continuous, minute analog signal representative of the magnetic data on disk platter 816. This minute analog signal is transferred from read/write head assembly 820 to read channel circuit 802 via preamplifier 804. Preamplifier 804 is operable to amplify the minute analog signals accessed from disk platter 816. In turn, read channel circuit 802 decodes and digitizes the received analog signal to recreate the information originally written to disk platter 816. This data is provided as read data 822 to a receiving circuit. As part of processing the received information, read channel circuit 802 performs a data detection process on the received signal using a data detector with pruning control system. Such a data detector with soft pruning may be implemented consistent with the disclosure above in relation to FIGS. 1-6. In some cases, the data detection may be performed consistent with the flow diagram disclosed above in relation to FIG. 7. A write operation is substantially the opposite of the preceding read operation with write data 824 being provided to read channel circuit 802 and written to disk platter 816.

It should be noted that storage system 800 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such storage system 800, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

Turning to FIG. 9, a wireless communication system 900 or data transmission device including a transmitter 902 and receiver 904 with a data detector with pruning control system is shown in accordance with some embodiments of the present invention. Communication system 900 includes a transmitter 902 that is operable to transmit encoded information via a transfer medium 906 as is known in the art. The encoded data is received from transfer medium 906 by receiver 904. Receiver 904 incorporates a data detector with pruning control system. Such a data detector with pruning control system may be implemented consistent with that described above in relation to FIGS. 1-6. In some cases, the data detection in receiver 904 may be done consistent with the flow diagrams in FIG. 7.

It should be noted that the various blocks discussed in the above application may be implemented in integrated circuits along with other functionality. Such integrated circuits may include all of the functions of a given block, system or circuit, or only a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the present invention provides novel apparatuses, systems, and methods for data detection in a data detector with soft pruning. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data detector comprising:
   a first set of counters operable to distinguish prunable data from non-prunable data in the data detector;
   a second set of counters operable to generate initial values for the first set of counters, wherein the second set of counters is operable to generate the initial values at least in part before a syncmark is detected in a data sector, and wherein the data detector is operable to initialize the first set of counters with the initial values when the syncmark is detected in the data sector; and
   a prune control signal generator operable to generate a prune control signal based on the first set of counters, wherein the prune control signal controls whether the data detector is allowed to prune a trellis.

2. The data detector of claim 1, further comprising a third set of counters operable to generate second initial values for the first set of counters, wherein the third set of counters is operable to generate the second initial values at least in part before a second syncmark is detected in the data sector, and wherein the data detector is operable to initialize the first set of counters with the second initial values when the second syncmark is detected in the sector.

3. The data detector of claim 2, further comprising a fourth set of counters operable to generate ending values for the first set of counters, wherein the data detector is operable to use the ending values for the first set of counters when a data fragment being processed in the data detector ends before the second syncmark is detected.

4. The data detector of claim 1, wherein the first set of counters comprises a clock cycle counter.

5. The data detector of claim 4, wherein the first set of counters comprises a J counter tracking a current data position in a codeword.

6. The data detector of claim 5, wherein the J counter is incremented when the clock cycle counter rolls over, and wherein the J counter rolls over when it reaches a codeword length.

7. The data detector of claim 6, wherein the J counter is only incremented when the current data position is in user data bits or parity bits.

8. The data detector of claim 6, wherein the first set of counters comprises a K counter tracking a current data position in a block of data comprising a parity portion and a user data portion.

9. The data detector of claim 8, wherein the K counter contains a remainder of a value of the J counter divided by a length of the block of data.

10. The data detector of claim 1, wherein the prunable data comprises user data bits, and wherein the non-prunable data comprises at least one bit of non-user data.

11. The data detector of claim 1, wherein the data detector is operable to prune the trellis when a data sequence to be pruned from the trellis comprises a sequence that is not generated by an upstream maximum-transition-run encoder and the prune control signal is asserted.

12. The data detector of claim 3, further comprising a first state machine operable to determine whether the initial values, the second initial values or the ending values are valid.

13. The data detector of claim 3, further comprising a second state machine operable to control counting in the second set of counters, the third set of counters and the fourth set of counters.

14. The data detector of claim 1, wherein the first set of counters, the second set of counters and the prune control signal generator comprise a pruning control system implemented as an integrated circuit.

15. The data detector of claim 1, wherein the first set of counters, the second set of counters and the prune control signal generator comprise a pruning control system incorporated in a storage device.

16. The data detector of claim 1, wherein the first set of counters, the second set of counters and the prune control signal generator comprise a pruning control system incorporated in a transmission device.

17. A method of detecting data in a data detector with a pruning control system, comprising:
    calculating initial values for a first set of counters using a second set of counters while searching for a syncmark in a sector of data;
    calculating second initial values for the first set of counters using a second set of counters while searching for a second syncmark in the sector of data;
    when the syncmark is detected, initializing the first set of counters with the initial values, and when the second syncmark is detected, initializing the first set of counters with the second initial values; and
    generating a prune control signal based on the first set of counters.

18. The method of claim 17, further comprising calculating ending values for the first set of counters for use when a data fragment is completed before the syncmark or the second syncmark are detected.

19. A storage system comprising:
    a storage medium maintaining a data set;
    a read/write head assembly operable to write the data set to the storage medium and to read the data set from the storage medium;
    a data detector with a pruning control system comprising:
        a first set of counters operable to distinguish user data from non-user data in the data set;
        a second set of counters operable to generate initial values for the first set of counters, wherein the second set of counters operates to generate the initial values at least in part before a syncmark is detected in a data sector, and wherein the initial values are used to initialize the first set of counters when the syncmark is detected in the data sector; and
        a prune control signal generator operable to generate a prune control signal based on the first set of counters, wherein the prune control signal controls whether the data detector is allowed to prune a trellis.

20. The storage system of claim 19, further comprising:
    a third set of counters operable to generate second initial values for the first set of counters, wherein the third set of counters is operable to generate the second initial values at least in part before a second syncmark is detected in the data sector, and wherein the pruning control system is operable to initialize the first set of counters with the second initial values when the second syncmark is detected in the sector; and
    a fourth set of counters operable to generate ending values for the first set of counters, wherein the pruning control system is operable to use the ending values for the first set of counters when a data fragment being processed in the data detector ends before the second syncmark is detected.

* * * * *